United States Patent
Lee et al.

(10) Patent No.: US 7,923,716 B2
(45) Date of Patent: Apr. 12, 2011

(54) NITRIDE SEMICONDUCTOR DEVICE

(75) Inventors: Soo Min Lee, Seoul (KR); Hee Seok Park, Gyunggi-do (KR); Jae Woong Han, Seoul (KR); Seong Suk Lee, Gyunggi-do (KR); Cheol Soo Sone, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/188,698

(22) Filed: Aug. 8, 2008

(65) Prior Publication Data

US 2009/0146132 A1 Jun. 11, 2009

(30) Foreign Application Priority Data

Dec. 6, 2007 (KR) .................. 10-2007-0126131

(51) Int. Cl.
*H01L 31/00* (2006.01)
(52) U.S. Cl. .............. 257/14; 257/21.089; 257/E33.033
(58) Field of Classification Search .................. 257/13, 257/94, 99, 103, 9, 14, 79, 98, E21.089, E33.03, 257/E33.033, E33.025, E33.028, E33.008; 438/22, 29, 39
See application file for complete search history.

(56) References Cited

U.S. PATENT DOCUMENTS

| | | | | |
|---|---|---|---|---|
| 6,744,064 B2 * | 6/2004 | Lee et al. | .............. | 257/13 |
| 2004/0161009 A1 * | 8/2004 | Edamura et al. | .............. | 372/45 |
| 2005/0199892 A1 * | 9/2005 | Cho et al. | .............. | 257/87 |
| 2006/0006375 A1 | 1/2006 | Ou et al. | | |
| 2006/0086932 A1 * | 4/2006 | Kim et al. | .............. | 257/13 |
| 2006/0108528 A1 * | 5/2006 | Qiu | .............. | 250/338.4 |
| 2007/0272915 A1 * | 11/2007 | Nakamura et al. | .............. | 257/14 |

FOREIGN PATENT DOCUMENTS

JP 2007-081449 3/2007

* cited by examiner

*Primary Examiner* — Thomas L Dickey
*Assistant Examiner* — Nikolay Yushin
(74) *Attorney, Agent, or Firm* — McDermott Will & Emery LLP

(57) ABSTRACT

There is provided a nitride semiconductor device including: an n-type nitride semiconductor layer; a p-type nitride semiconductor layer; and an active layer formed between the n-type and p-type nitride semiconductor layers, the active layer including a plurality of quantum well layers and at least one quantum barrier layer deposited alternately with each other, wherein the active layer includes a first quantum well layer, a second quantum well layer formed adjacent to the first quantum well layer toward the p-type nitride semiconductor layer and having a quantum level higher than a quantum level of the first quantum well layer, and a tunneling quantum barrier layer formed between the first and second quantum well layers and having a thickness enabling a carrier to be tunneled therethrough.

13 Claims, 6 Drawing Sheets

NITRIDE SEMICONDUCTOR DEVICE

CROSS-REFERENCE TO RELATED APPLICATIONS

This application claims the priority of Korean Patent Application No. 2007-0126131 filed on Dec. 6, 2007, in the Korean Intellectual Property Office, the disclosure of which is incorporated herein by reference.

BACKGROUND OF THE INVENTION

1. Field of the Invention

The present invention relates to a nitride semiconductor device, and more particularly, to a nitride semiconductor device improved in emission efficiency due to an active layer having an optimal structure of quantum barrier and quantum well layers, notably, when operating in a high current.

2. Description of the Related Art

In general, a nitride semiconductor is broadly utilized in a green or blue light emitting diode (LED) or a laser diode (LD) which serves as a light source in a full color display, an image scanner, various signal systems and optical communication devices. This nitride semiconductor device may act as a light emitting device including an active layer emitting light of various colors such as green and yellow by virtue of recombination of electrons and holes.

Since development of the nitride LED, technological advancement has been made remarkably to broaden the scope of application of the nitride LED. Accordingly, the LED has been significantly researched as a light source for general lighting. Particularly, conventionally the nitride light emitting device has been mainly used as parts employed in a mobile product of low current and low output. However, recently, the nitride light emitting device has seen its application expanding to the high current and high output field. This has led to an urgent need for developing an LED structure with high efficiency in a high current.

FIG. 1 is a cross-sectional view illustrating a conventional nitride semiconductor device.

Referring to FIG. 1, the nitride semiconductor device 10 includes a sapphire substrate 11, and an n-type nitride semiconductor layer 12, an active layer 15 of a multiple quantum well structure, a p-type nitride semiconductor layer 17 and a transparent electrode layer 18 formed sequentially on the sapphire substrate 11.

The n-type nitride semiconductor layer 12 is partially etched to provide an area for forming an n-electrode 19a. A p-electrode 19b is formed on the transparent electrode layer 18.

Here, the active layer 15 is formed of a multiple quantum well structure having a plurality of quantum well layers 15a and quantum barrier layers 15b deposited alternately with each other.

This nitride semiconductor device has emission efficiency determined largely by recombination probability of electrons and holes in the active layer, i.e., internal quantum efficiency.

To enhance internal quantum efficiency, studies have been directed at increasing the number of effective carriers involved in light emission by improving a structure of the active layer. That is, to ensure a greater number of effective carriers in the active layer, there has been a need to reduce the number of carriers overflowing outside of the active layer.

Also, carriers are limitedly injected to a specific local area of the active layer to thereby reduce an effective active area in the total active layer. Such a decline in the effective active area directly leads to degradation in light emitting efficiency. This accordingly has called for a method for assuring recombination in the entire active layer.

A more detailed description will be given with reference to FIG. 2.

FIG. 2A illustrates a simulation result for carrier concentration of an active layer having seven pairs of quantum well layers and quantum barrier layers with a thickness of 30 Å, and 150 Å, respectively in a conventional nitride semiconductor device. FIG. 2B illustrates a simulation result for rediative recombination rate of an active layer having seven pairs of quantum well layers and quantum barrier layers with a thickness of 30 Å, and 150 Å, respectively in a conventional nitride semiconductor device.

First, according to the carrier concentration (electrons indicated by a dotted line and holes indicated by a solid line) shown in FIG. 2A, the holes are relatively less mobile than the electrons and thus with increase in the number of pairs, the holes are far less likely to survive. With a greater distance of the electrons and holes from the n-type and p-type nitride semiconductor layers, respectively, the electrons and holes are less distributed. But the holes are relatively more rapidly decreased. Thus, as shown in FIG. 2B, effective recombination probability is shown high in a quantum well layer located in an area II near the p-type nitride semiconductor layer.

The effective recombination probability of the active layer as described above may be much further decreased notably when utilized in a lighting device requiring a high current. Therefore, this has led to a need in the art for a multiple quantum well structure capable of increasing emission efficiency when the light emitting device operates in a high current.

SUMMARY OF THE INVENTION

An aspect of the present invention provides a nitride semiconductor device significantly improved in emission efficiency when operating in a high currency due to an optimal multiple quantum well structure.

According to an aspect of the present invention, there is provided a nitride semiconductor device including: an n-type nitride semiconductor layer; a p-type nitride semiconductor layer; and an active layer formed between the n-type and p-type nitride semiconductor layers, the active layer including a plurality of quantum well layers and at least one quantum barrier layer deposited alternately with each other, wherein the active layer includes a first quantum well layer, a second quantum well layer formed adjacent to the first quantum well layer toward the p-type nitride semiconductor layer and having a quantum level higher than a quantum level of the first quantum well layer, and a tunneling quantum barrier layer formed between the first and second quantum well layers and having a thickness enabling a carrier to be tunneled therethrough.

The active layer may include a plurality of quantum barrier layers, and one of the quantum barrier layers is formed adjacent to the second quantum well layer toward the p-type nitride semiconductor layer, wherein the one quantum barrier layer is a crystal quality improvement layer having a thickness greater than a thickness of the tunneling quantum barrier layer.

The active layer may include the first quantum well layer, the tunneling quantum barrier layer, the second quantum well layer and the crystal quality improvement layer as one unit structure, and has the unit structure repeated at least once.

The unit structure may be repeated one to thirty times.

The second quantum well layer may have a thickness smaller than a thickness of the first quantum well layer.

The first quantum well layer may have a thickness of 20 to 60 Å.

The second quantum well layer may have a thickness of 10 to 50 Å.

The tunneling quantum barrier layer may have a thickness of 10 to 80 Å.

The crystal quality improvement layer may have a thickness of 30 to 200 Å.

The second quantum well layer may have the quantum level defined by doping.

The active layer may further include: a third quantum well layer formed adjacent to the first quantum well layer toward the n-type nitride semiconductor layer and having a quantum level higher than a quantum level of the first quantum well layer; and a second tunneling quantum barrier layer formed between the first and third quantum well layers and having a thickness enabling a carrier to be tunneled therethrough.

The third quantum well layer may have a thickness of 10 to 50 Å.

The second tunneling quantum barrier layer has a thickness of 10 to 80 Å.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
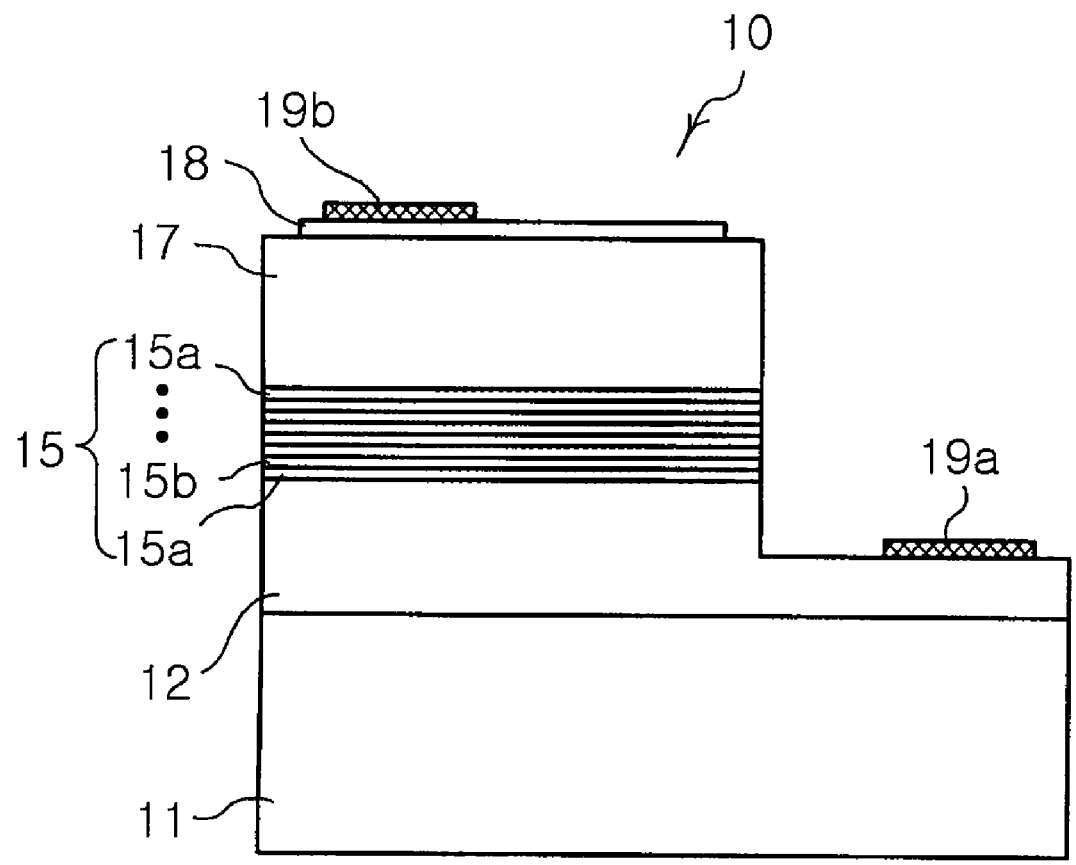
FIG. 1 is a cross-sectional view illustrating a conventional nitride semiconductor device.
Figure 2A:
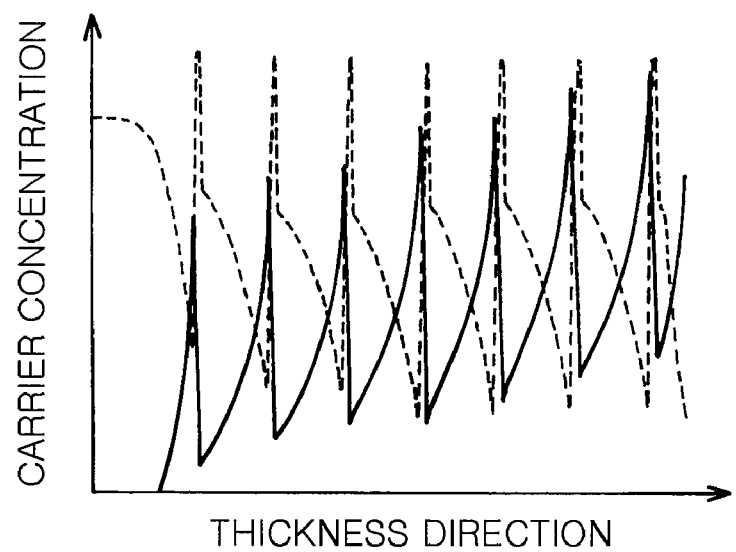
FIGS. 2A and 2B are simulation results illustrating carrier concentration and radiative recombination rate distribution of an active layer having seven pairs of quantum well layers each having a thickness of 30 Å and quantum barrier layers each having a thickness of 150 Å in a conventional nitride semiconductor device, respectively.
Figure 2B:
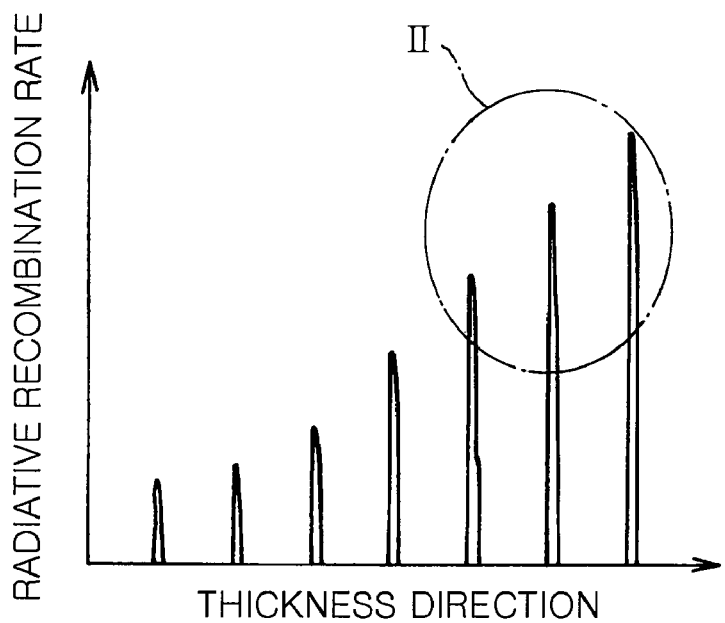

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 3:
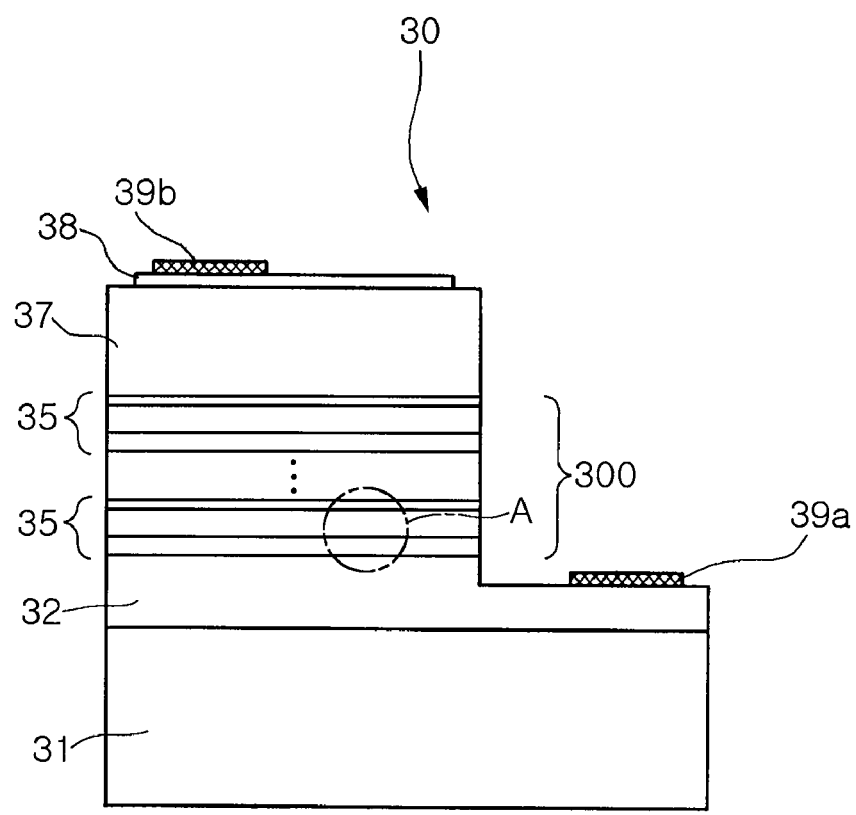
FIG. 3 is a cross-sectional view illustrating a nitride semiconductor device according to an exemplary embodiment of the invention.
Figure 4:
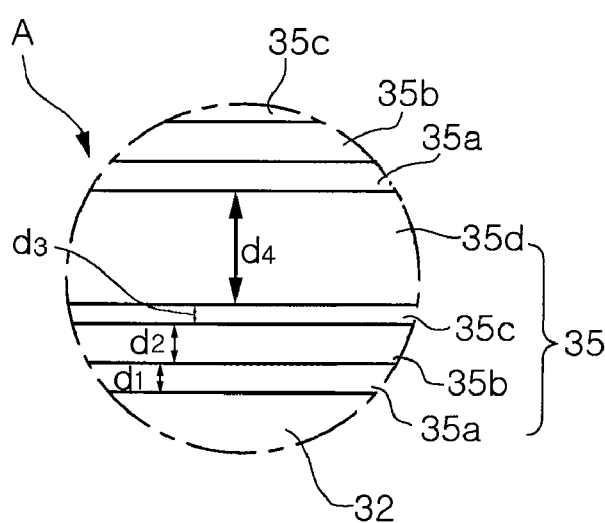
FIG. 4 is a magnified view illustrating an area indicated with A in FIG. 3.

FIG. 3 is a cross-sectional view illustrating a nitride semiconductor device according to an exemplary embodiment of the invention. FIG. 4 is a magnified view illustrating an area indicated with A in FIG. 3.

First, referring to FIG. 3, the nitride semiconductor device 30 includes a substrate 31, an n-type nitride semiconductor layer 32, an active layer 300 and a p-type nitride semiconductor layer 37.

The n-type nitride semiconductor layer 32 may be partially exposed to have an n-type electrode 39a formed on a top of the exposed portion of the n-type nitride semiconductor layer 32. Also, a transparent electrode layer 38 and a p-type electrode 39b may be sequentially formed on a top of the p-type nitride semiconductor layer 37.

The present embodiment illustrates a planar nitride semiconductor device where the n-type and p-type electrodes 39a and 39b are arranged to face an identical direction. But the present invention is not limited thereto but it is readily understood to those skilled in the art that the present invention may be applied to a vertical nitride semiconductor device.

The substrate 31 is used for growing a nitride single crystal, and in general utilizes a sapphire substrate. Also, the substrate 31 may be made of SiC, GaN, ZnO, $MgAl_2O_4$, MgO, $LiAlO_2$ or $LiGaO_2$.

Although not shown, according to the present embodiment, a buffer layer, e.g., undoped GaN layer may be grown to improve crystal quality of a nitride semiconductor single crystal grown on the substrate 31.

The n-type and p-type nitride semiconductor layers 32 and 37 may be formed of semiconductor materials doped with n-dopant and p-dopant having a composition expressed by $Al_xIn_yGa_{(1-x-y)}N$, where $0 \leq x \leq 1$, $0 \leq y \leq 1$, and $0 \leq x+y \leq 1$, respectively. Representative examples for such semiconductor materials include GaN, AlGaN, and InGaN. Moreover, the n-type dopant may employ Si, Ge, Se, Te or C, and the p-type dopant may adopt Mg, Zn or Be.

The active layer 300 formed between the n-type and the p-type nitride semiconductor layers 32 and 37 emits light having a predetermined energy due to recombination of electrons and holes. As shown in FIG. 3, the active layer 300 is formed of a multiple quantum well structure having a plurality of quantum well layers and a plurality of quantum barrier layers deposited alternately with each other.

Particularly, in the present embodiment, the active layer features a repeated structure of four layers including two quantum well layers and two quantum barrier layers deposited alternately with each other as one unit 35. This repeated structure is designed to ensure smooth migration of carriers in the active layer.

To describe in detail the four-layer unit structure 35 of the quantum well layers and the quantum barrier layers, an area indicated with A in FIG. 3 is magnified in FIG. 4.

As shown in FIG. 4, the multiple quantum well structure of the present embodiment is defined by repetition of the four-layer unit structure 35 including the two quantum well layers 35a and 35c and the two quantum barrier layers 35b and 35d.

Hereinafter, the quantum well layers 35a and 35c and the quantum barrier layers 35b and 35d are referred to as a first quantum well layer 35a, a tunneling quantum barrier layer 35b, a second quantum well layer 35c and a crystal quality improvement layer 35d based on functional considerations.

The first quantum well layer 35a is adjacent to the n-type nitride semiconductor layer 32, from which electrons are injected most primarily. The first quantum well layer serves as a major light emitting layer in the four-layer unit structure 35.

The tunneling quantum barrier layer 35b has a thickness d2 enabling carriers from the first quantum well layer 35a or the second quantum well layer 35c to be tunneled therethrough. This accordingly allows the carriers to migrate smoothly to an adjacent one of the quantum well layers.

The second quantum well layer 35c has a quantum level higher than a quantum level of the first quantum well layer 35a. To this end, in the present embodiment, the second quantum well layer 35c has a thickness smaller than a thickness of the first quantum well layer 35a. As will be described later, the second quantum well layer 35c with a high quantum level mainly performs a step-like function to allow the carriers to migrate easily to the adjacent quantum well layer, and performs relatively weak light emission function.

The crystal quality improvement layer 35d is a quantum barrier layer for overcoming a problem with decline in crystal quality resulting from the first quantum well layer 35a, tunneling quantum barrier layer 35b and second quantum well layer 35c deposited previously to have a thickness of tens of Å. That is, in the multiple quantum well structure of the present embodiment, structural features of the first quantum well layer 35a, tunneling quantum barrier layer 35b and second quantum well layer 35c may increase mobility of the carriers in the active layer. This accordingly allows the crystal quality improvement layer 35d, i.e., adjacent quantum barrier layer to be grown with relative great thickness for recovering crystal quality degradation from multiple thin layer doposition.

Therefore, the crystal quality improvement layer 35d has a thickness d4 greater than a thickness of the tunneling quantum barrier layer 35b. However, an adequate thickness limitation of the crystal quality improvement layer 35d is not essential according to the present invention. The crystal quality improvement layer 35d may have a thickness adequately adjusted in view of the thickness of the active layer 300 and blue shift phenomenon, which will be described later.

Figure 5:
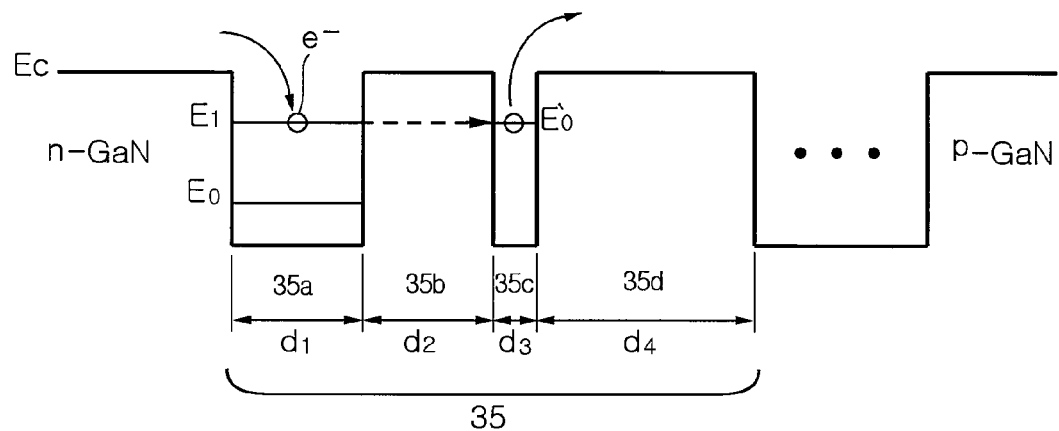
FIG. 5 illustrates a conduction band energy level of a multiple quantum well structure shown in FIG. 4.

Hereinafter, the function of the four-layer unit structure 35 will be described in more detail with reference to FIG. 5. FIG. 5 illustrates a conduction band energy level of a multiple quantum well structure shown in FIG. 4. For explanatory convenience, FIG. 5 shows only migration of electrons as carriers.

First, portions of electrons e− injected into the first quantum well layer 35a emit light of a predetermined wavelength by recombination with holes for light emission. When the electrons are injected in a great amount, the first quantum well layer 35a has an energy level E0 and E1 filled with the electrons, and extra electrons are tunneled through the adjacent tunneling quantum barrier layer 35b and injected into the second quantum well layer 35c.

Here, as will be described later, the second quantum well layer 35c has a quantum level higher than a quantum level of the first quantum well layer 35a. Accordingly, the electrons can be tunneled more easily from a high quantum level of the first quantum well layer 35a to a zero quantum level $E'_0$ of the second quantum well layer 35c.

To perform this tunneling function, the tunneling quantum barrier layer 35b has a thickness d2 of about 10 to 80 Å. Also, the first quantum well layer 35a has a thickness d1 of 20 to 60 Å to possess high internal quantum efficiency due to quantum effects.

The electrons injected into the second quantum well layer 35c by tunneling have a quantum level higher than a quantum level of the first quantum well layer 35a. As described above, it is construed that the second quantum well layer 35c mainly performs a step-like function enabling the electrons to migrate to other adjacent quantum well layer, specifically, another first quantum well layer of the next 4-layer unit.

To achieve the high quantum level, the second quantum well layer 35c may have a thickness smaller than a thickness of the first quantum well layer 35a. Particularly, the second quantum well layer 35c has a thickness d3 of 10 to 50 Å.

As described above, the second quantum well layer 35c with a high quantum level allows the electrons to be injected to the adjacent quantum well layer with greater efficiency, thereby broadening an overall effective active area of the active layer.

Meanwhile, to achieve the high quantum level of the second quantum well layer 35c, the second quantum well layer may have a relatively smaller thickness. Alternatively, the second quantum well layer may be doped with an appropriate material or adjusted in indium or aluminum content.

The crystal quality improvement layer 35d may have a thickness as small as e.g., that of the first quantum well layer 35a, tunneling quantum barrier layer 35b and second quantum well layer 35c, respectively to beneficially ensure the electrons to be injected to the adjacent quantum well layer. However, in the present embodiment, the crystal quality improvement layer 35d is formed mainly to improve crystal quality.

That is, the first quantum well layer 35a, tunneling quantum barrier layer 35b and second quantum well layer 35c having a relatively small thickness to perform functions described above do not exhibit superior crystal quality. These layers with the small thickness, when deposited repeatedly, allow the carriers to be injected with efficiency but may not bring about big increase in overall light emission efficiency due to decline in crystal quality.

Therefore, the crystal quality improvement layer 35d may have a relatively greater thickness than that of each of the layers 35a, 35b, and 35c previously deposited.

However, as will be described with reference to FIG. 9, the crystal quality improvement layer 35d with too great a thickness leads to increase in the supplied current, thereby aggravating blue shift of emitted light wavelength. Considering this, the crystal quality improvement layer 35d may have a thickness d4 of 30 to 200 Å.

Furthermore, the multiple quantum well structure of the present embodiment has a feature such that the first quantum well layer 35a, tunneling quantum barrier layer 35b, second quantum well layer 35c and crystal quality improvement layer 35d constitute one unit structure 35 and this unit structure 35 is repeated multiple times. This accordingly improves carrier mobility between the quantum well layers, and semiconductor crystal quality. Particularly, the light emitting device achieves superior light emitting efficiency when operating in a high current.

Here, the active layer 300 may feature repetition of only one unit structure 35 or a plurality of unit structures. The unit structures 35 may be repeated in optimal numbers according to driving current density of a device. Generally, increase in current density leads to increase in optimal repetition numbers. The unit structures 35, when repeated multiple times, may be repeated 30 times or less. That is, the number of quantum well layers and quantum barrier layers may be sixty or less, respectively.

Meanwhile, the quantum well layers 35a and 35c and quantum barrier layers 35b and 35d may be structured, for example, such that InGaN and GaN are repeatedly deposited. In this case, the quantum well layers and quantum barrier layers may have accurate compositions properly selected according to required wavelength.

Figure 6:
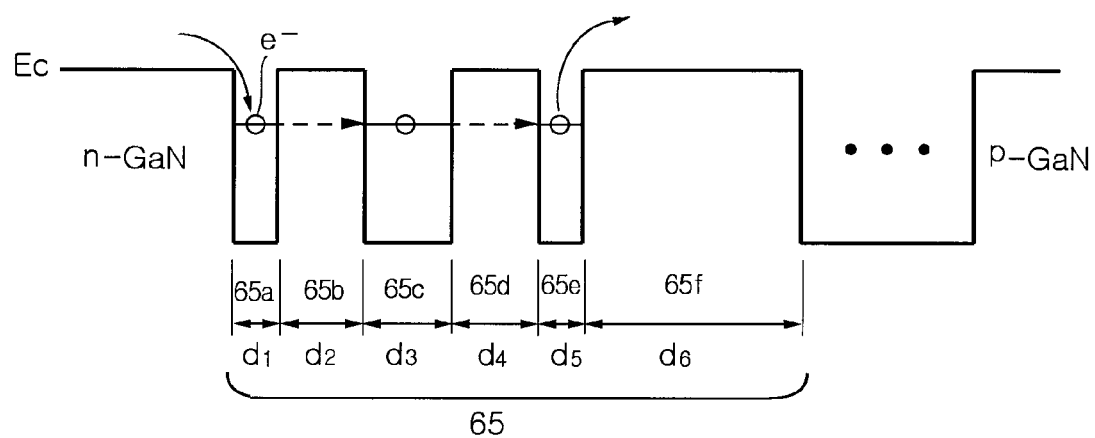
FIG. 6 illustrates a conduction band energy level of a multiple quantum well structure employed in a nitride semiconductor device according to another exemplary embodiment of the invention.

FIG. 6 illustrates a conduction band energy level of a multiple quantum well structure employed in a nitride semiconductor device according to another exemplary embodiment of the invention.

In the present embodiment, the unit structure of the multiple quantum well structure includes two more layers compared with the previous embodiment.

That is, as shown in FIG. 6, the unit structure 65 of the multiple quantum well structure according to the present embodiment, in the same manner as FIG. 5, includes a first quantum well layer 65c, a first tunneling quantum barrier layer 65d, a second quantum well layer 65e and a crystal quality improvement layer 65f. In addition, the unit structure 65 further includes a third quantum well layer 65a and a second tunneling quantum barrier layer 65b.

In the present embodiment, not only mobility of electrons but also mobility of holes is considered. The third quantum well layer 65a is additionally disposed on a migration path of the holes to allow the holes to be injected easily into an adjacent one of the quantum well layers. The tunneling quantum barrier layer 65b is employed for the same purpose as the first tunneling quantum barrier layer 65d.

That is, only difference between the present embodiment and the previous embodiment lies in carriers whose injection efficiency will be improved. The third quantum well layer 65a and the second tunneling quantum barrier layer 65b are equivalent to the second quantum well layer 65e and the first tunneling quantum barrier layer 65d, respectively.

Therefore, FIG. 6 shows overall carrier mobility similar to that of FIG. 5. However, the electrons e– injected into the third quantum well layer 65a are injected into the first quantum well layer 65c by tunneling. Therefore, in the same manner as FIG. 5, in the present embodiment, the first quantum well layer 65c also serves as a major light emitting layer.

Carrier mobility after migration through the first quantum well layer 65c and function of each layer can be described with reference to the previous embodiment without going into further detail.

Hereinafter, a description will be given of how much improvement is achieved by the multiple quantum well structure of the present embodiments compared to the conventional multiple quantum well structure.

Figure 7A:
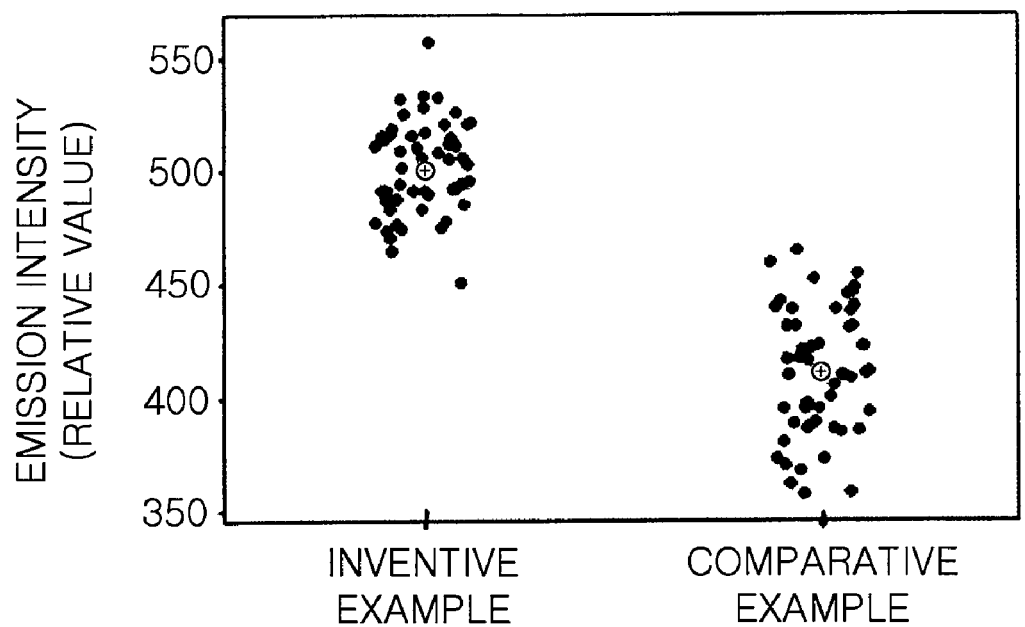
FIGS. 7A and 7B are graphs illustrating comparison results for emission intensity between a conventional multiple quantum well structure and a multiple quantum well structure according to an exemplary embodiment of the invention.
Figure 7B:
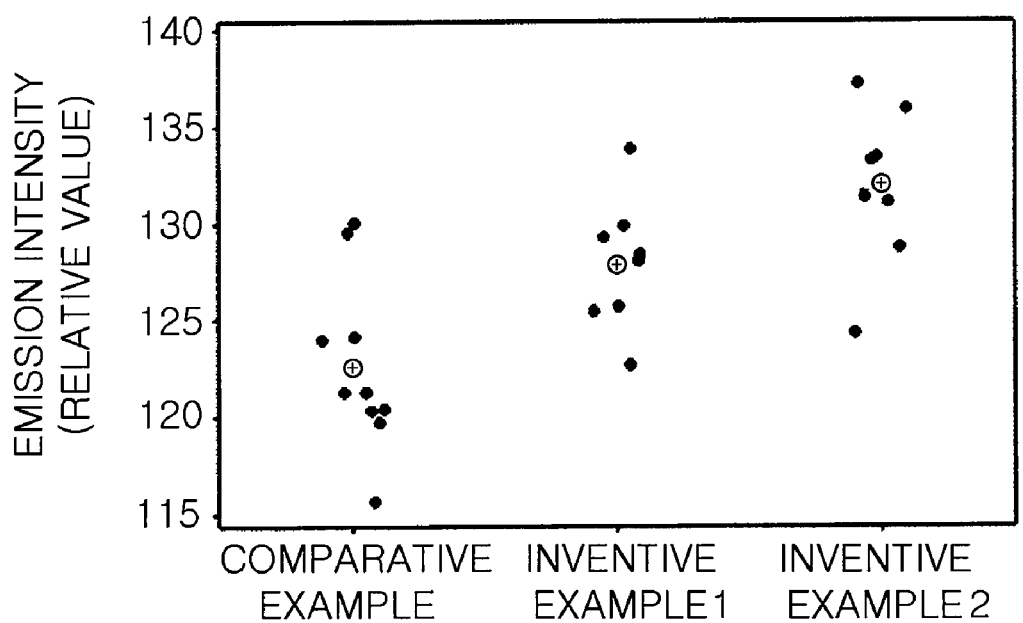

FIGS. 7A and 7B are graphs illustrating comparison results for emission intensity between a conventional multiple quantum well structure and a multiple quantum well structure according to an exemplary embodiment of the invention.

First, FIG. 7A shows comparison results between Inventive Example and Comparative Example when a chip has a size of 1 mm×1 mm and a current density of 10 A/cm². Here, in Inventive Example, like a structure of FIG. 3, four layers constitute one unit structure. Specifically, the first quantum well layer has a thickness of 30 Å, the tunneling quantum barrier layer has a thickness of 30 Å, the second quantum well layer has a thickness of 20 Å, and the crystal quality improvement layer has a thickness of 90 Å. The unit structure is repeated five times.

Meanwhile, in Comparative Example, the quantum well layer and the quantum barrier layer each have a thickness of 30 Å to form a superlattice structure. A pair of the quantum well layer and a pair of the quantum barrier layer are repeated 14 times so that the active layer has an overall thickness identical to Inventive Example.

As shown in FIG. 7A, the Inventive Example is increased in light emission intensity by 22% on average compared to Comparative Example. This is because the multiple quantum well structure of a superlattice structure is improved in carrier injection efficiency due to tunneling but degraded in emission efficiency due to decline in crystal quality.

In contrast, Inventive Example structured as in FIG. 3 is designed to ensure easy carrier mobility and better crystal quality due to tunneling and higher quantum level, thereby achieving superior light emitting efficiency.

FIG. 7B is a graph illustrating comparison results for light emitting intensity between Conventional Example and Inventive Examples. FIG. 7B shows test results at a higher density of 35 A/cm² than FIG. 8A.

Inventive Example 1 and Comparative Example of FIG. 7B are identically structured to the Inventive and Comparative Examples described with reference to FIG. 7A. In Inventive Example 2, as structured as in FIG. 3, one unit structure includes four layers, in which a first quantum well layer has a thickness of 30 Å, a tunneling quantum barrier layer has a thickness of 30 Å, a second quantum well layer has a thickness of 20 Å, and a crystal quality improvement layer has a thickness of 50 Å. For all three cases, to ensure similar thicknesses of respective active layers, the unit structure is repeated five times in Inventive Example 1, seven times in Inventive Example 2 and fourteen times in Comparative Example.

Based on test results, Inventive Example demonstrates noticeable increase in light emission intensity at a high current density. Particularly, higher light emitting efficiency can be achieved at a high current density by increasing a repetition number of the unit structure while relatively thinning, not thickening, the crystal quality improvement layer.

Figure 8:
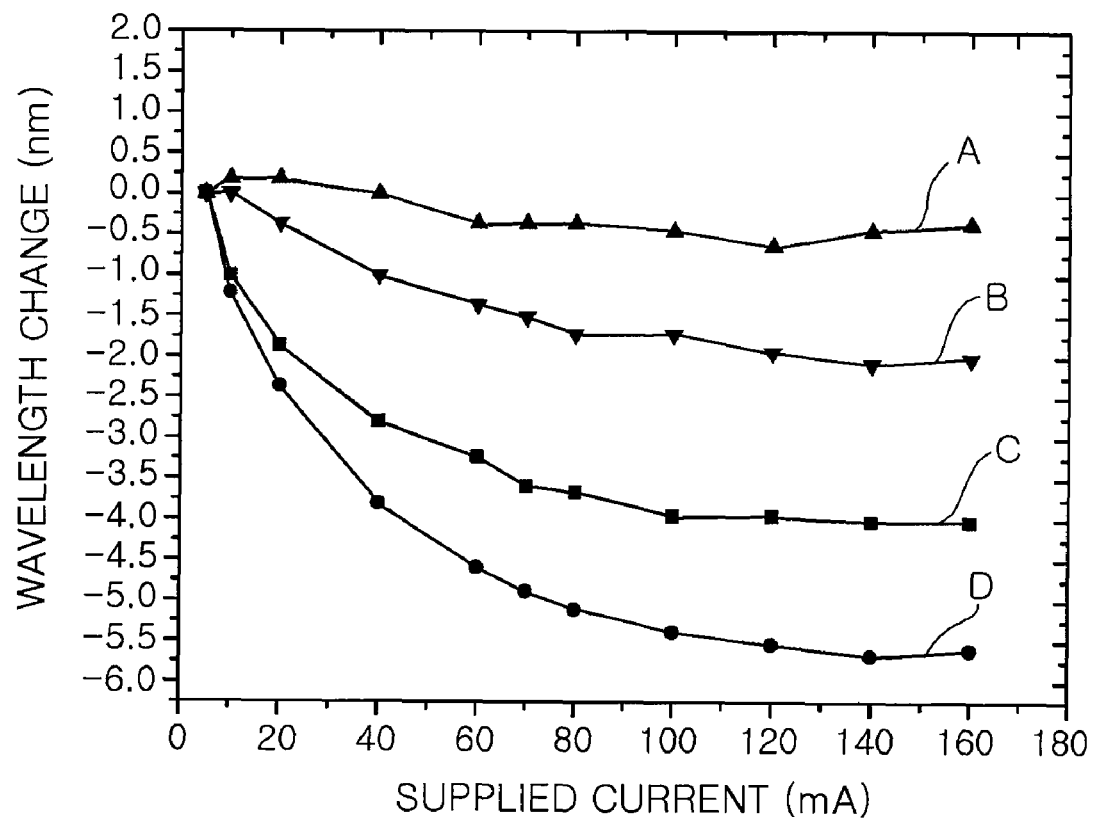
FIG. 8 is a graph illustrating a change in emission wavelength with respect to a thickness of a crystal quality improvement layer in a multiple quantum well structure according to an exemplary embodiment of the invention.

FIG. 8 is a graph illustrating a change in emission wavelength with respect to a thickness of a crystal quality improvement layer in a multiple quantum well structure according to an exemplary embodiment of the invention.

Referring to FIG. 8, graphs indicated with A and B show results of Comparative Example when quantum barrier layers each have a thickness of 30 Å. Graphs C and D for Inventive Examples plot results when the crystal quality improvement layer has a thickness of 50 Å and 90 Å, respectively.

Referring to FIG. 8, with increase in the thickness of the crystal quality improvement layer, the light emitting device suffers deterioration in blue shift, particularly, when operating in a high current.

Accordingly, the crystal quality improvement layer may have an optimal thickness determined considering test results, emission efficiency improvement effects of the crystal quality improvement layer and current density of an actual device. In view of these factors, the crystal quality improvement layer may have a thickness of 30 to 200 Å.

As set forth above, a nitride semiconductor device according to exemplary embodiments of the invention is significantly improved in emission efficiency when operating in a high current due to an active layer having an optimized multiple quantum well structure.

In addition, a semiconductor single crystal of the nitride semiconductor device can be improved in crystal quality.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor device comprising:
an n-type nitride semiconductor layer;
a p-type nitride semiconductor layer; and
an active layer formed between the n-type and p-type nitride semiconductor layers, the active layer comprising a plurality of quantum well layers and at least one quantum barrier layer deposited alternately with each other, wherein the active layer comprises a first quantum well layer, a second quantum well layer formed adjacent to the first quantum well layer toward the p-type nitride semiconductor layer and having a zero quantum level higher than a zero quantum level of the first quantum well layer, and a tunneling quantum barrier layer formed between the first and second quantum well layers and having a thickness enabling a carrier to be tunneled therethrough, wherein the first quantum well layer has the same band gap energy as that of the second quantum well layer.

2. The nitride semiconductor device of claim 1, wherein the active layer comprises a plurality of quantum barrier layers, and one of the quantum barrier layers is formed adjacent to the second quantum well layer toward the p-type nitride semiconductor layer, wherein the one quantum barrier layer is a crystal quality improvement layer having a thickness greater than a thickness of the tunneling quantum barrier layer.

3. The nitride semiconductor device of claim 2, wherein the active layer comprises the first quantum well layer, the tunneling quantum barrier layer, the second quantum well layer and the crystal quality improvement layer as one unit structure, and has the unit structure repeated at least once.

4. The nitride semiconductor device of claim 3, wherein the unit structure is repeated one to thirty times.

5. The nitride semiconductor device of claim 1, wherein the second quantum well layer has a thickness smaller than a thickness of the first quantum well layer.

6. The nitride semiconductor device of claim 1, wherein the first quantum well layer has a thickness of 20 to 60 Å.

7. The nitride semiconductor device of claim 1, wherein the second quantum well layer has a thickness of 10 to 50 Å.

8. The nitride semiconductor device of claim 1, wherein the tunneling quantum barrier layer has a thickness of 10 to 80 Å.

9. The nitride semiconductor device of claim 1, wherein the crystal quality improvement layer has a thickness of 30 to 200 Å.

10. The nitride semiconductor device of claim 1, wherein the second quantum well layer has the quantum level defined by doping.

11. The nitride semiconductor device of claim 1, wherein the active layer further comprises:

a third quantum well layer formed adjacent to the first quantum well layer toward the n-type nitride semiconductor layer and having a quantum level higher than a quantum level of the first quantum well layer; and a second tunneling quantum barrier layer formed between the first and third quantum well layers and having a thickness enabling a carrier to be tunneled therethrough.

12. The nitride semiconductor device of claim 11, wherein the third quantum well layer has a thickness of 10 to 50 Å.

13. The nitride semiconductor device of claim 11, wherein the second tunneling quantum barrier layer has a thickness of 10 to 80 Å.

\* \* \* \* \*